United States Patent
Albers et al.

(10) Patent No.: US 11,975,963 B2
(45) Date of Patent: May 7, 2024

(54) MICROELECTROMECHANICAL SYSTEMS ("MEMS") DEVICE HAVING A BUILT-IN SELF-TEST ("BIST") AND A METHOD OF APPLICATION OF A BIST TO MEASURE MEMS HEALTH

(71) Applicant: Knowles Electronics, LLC, Itasca, IL (US)

(72) Inventors: John J. Albers, Chicago, IL (US); Jorge Grilo, Chicago, IL (US)

(*) Notice: Subject to any disclaimer, the term of this patent is extended or adjusted under 35 U.S.C. 154(b) by 482 days.

(21) Appl. No.: 17/232,398

(22) Filed: Apr. 16, 2021

(65) Prior Publication Data

US 2022/0332569 A1    Oct. 20, 2022

(51) Int. Cl.
*B81B 7/00* (2006.01)
*H04R 3/04* (2006.01)

(52) U.S. Cl.
CPC .............. *B81B 7/008* (2013.01); *H04R 3/04* (2013.01); *B81B 2201/0257* (2013.01); *H04R 2201/003* (2013.01)

(58) Field of Classification Search
CPC ... B81B 7/008; B81B 2201/0257; H04R 3/04; H04R 2201/003
USPC ........................................................ 257/415
See application file for complete search history.

(56) References Cited

U.S. PATENT DOCUMENTS

| | | | |
|---|---|---|---|
| 6,985,271 B2* | 1/2006 | Yazdi | G02B 26/0841 |
| | | | 359/291 |
| 8,995,694 B2 | 3/2015 | Vos et al. | |
| 9,459,276 B2 | 10/2016 | Joseph | |
| 9,635,460 B2 | 4/2017 | Schultz et al. | |
| 9,743,191 B2 | 8/2017 | Pal et al. | |
| 9,781,505 B2 | 10/2017 | Szczech et al. | |
| 10,045,104 B2 | 8/2018 | Qutub et al. | |
| 2012/0056282 A1 | 3/2012 | Van Lippen et al. | |
| 2015/0355222 A1* | 12/2015 | Zhang | B81B 3/0094 |
| | | | 73/514.32 |
| 2016/0134975 A1 | 5/2016 | Kuntzman et al. | |
| 2016/0277846 A1 | 9/2016 | Lee | |
| 2020/0154223 A1 | 5/2020 | Du et al. | |
| 2020/0249052 A1 | 8/2020 | Steele et al. | |
| 2020/0329324 A1 | 10/2020 | Loeppert et al. | |
| 2021/0136493 A1 | 5/2021 | Berthelsen et al. | |

* cited by examiner

*Primary Examiner* — Tu-Tu V Ho
(74) *Attorney, Agent, or Firm* — Flener IP & Business Law; Zareefa B. Flener

(57) ABSTRACT

A microelectromechanical systems (MEMS) device includes a MEMS die and an electrical circuit electrically connected to the MEMS die. The electrical circuit includes a first capacitor that produces a first output signal based on a signal received from the MEMS die, and a second capacitor that produces a second output signal based on a signal received from the MEMS die. The electrical circuit is configured to determine a nominal capacitance of the MEMS die based on a ratio of the first output signal to the second output signal and a ratio of the capacitances of the first and second capacitors.

8 Claims, 5 Drawing Sheets

MICROELECTROMECHANICAL SYSTEMS ("MEMS") DEVICE HAVING A BUILT-IN SELF-TEST ("BIST") AND A METHOD OF APPLICATION OF A BIST TO MEASURE MEMS HEALTH

FIELD OF THE DISCLOSURE

The present disclosure relates generally to microelectromechanical systems ("MEMS") devices and more particularly MEMS devices having a built-in self-test ("BIST") to measure the health of a MEMS die, and methods of application of a BIST to measure the health of a MEMS device.

BACKGROUND

Presently, many systems may include one or more integrated microelectromechanical systems ("MEMS") dies, electret, or other acoustic sensors. Such systems include for example wireless communication handsets, laptop computers, and smart speakers among other devices. For example, many types of acoustic sensors include a MEMS die, such as a MEMS transducer, having a diaphragm, a backplate, and an integrated circuit. In such MEMS dies, the relative movement between the backplate and diaphragm causes a change in capacitance, which is detected by the integrated circuit and ultimately interpreted as sound. The performance of such MEMS dies may decline and/or ultimately fail due to particles and other contaminants on the diaphragm and/or as the MEMS die nears the end of its lifecycle. In systems including integrated MEMS dies it may be difficult to determine the current health of the MEMS die, both at the time of manufacture and throughout its lifecycle. Conventional techniques for verifying that the diaphragm of the MEMS die is free from contamination require at least partial disassembly of the system integrated therein, resulting in possible damage to the MEMS die or to other system components and is time insensitive. Other known techniques are effective only at detecting gross failures of MEMS dies. A need therefore exists for a MEMS device having a built-in self-test ("BIST") and/or methods thereof that can be utilized to test the health of a MEMS die throughout its lifecycle without requiring visual inspection of the diaphragm and/or further disassembly of the system the MEMS die is integrated within.

BRIEF DESCRIPTION OF THE DRAWINGS

The foregoing and other features of the present disclosure will become more fully apparent from the following description and appended claims, taken in conjunction with the accompanying drawings. These drawings depict only several embodiments in accordance with the disclosure and are, therefore, not to be considered limiting of its scope.

Figure 1:
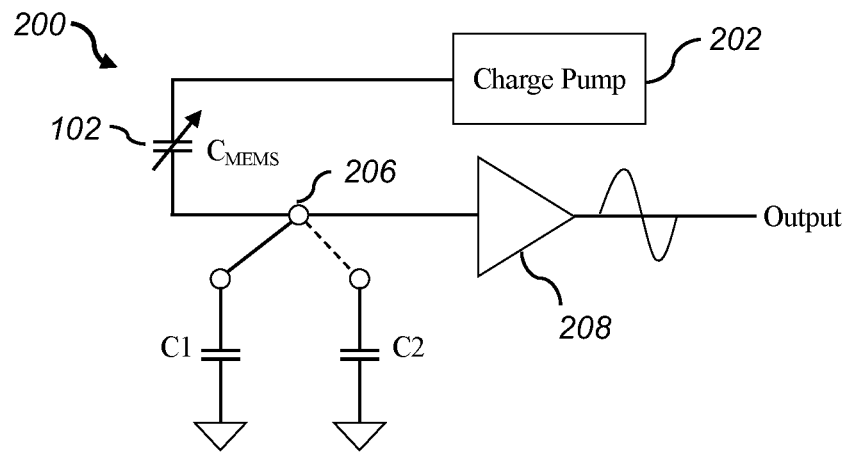
FIG. 1 is an example electrical circuit of a MEMS device configured to determine the nominal capacitance of a MEMS die, according to an illustrative embodiment.

In the following detailed description, various embodiments are described with reference to the appended drawings. The skilled person will understand that the accompanying drawings are schematic and simplified for clarity. Like reference numerals refer to like elements or components throughout. Like elements or components will therefore not necessarily be described in detail with respect to each figure.

DETAILED DESCRIPTION

In general, disclosed herein is a microelectromechanical systems ("MEMS") device having a built-in self-test ("BIST"). According to various embodiments, the MEMS device includes a MEMS die and an electrical circuit electrically connected to the MEMS die.

According to an embodiment, the electrical circuit includes a first capacitor and a second capacitor which produce a first and a second output signal, respectively, based on a signal received from the MEMS die. In this embodiment, the electrical circuit is configured to determine a nominal capacitance of the MEMS die. The nominal capacitance of the MEMS die is determined based on a ratio of the first signal to the second signal and a ratio of the capacitances of the first and second capacitors. Advantageously, using a BIST to determine the nominal capacitance of the MEMS die rather than conventional testing techniques reduces the need to disassemble the MEMS device to visually inspect the MEMS die and provides ease of testing the health of the MEMS die both at the time of manufacture and throughout its life cycle.

In an embodiment, the electrical circuit further comprises a signal generator configured to inject an electrical input into the MEMS die. In an embodiment, the electrical input injected into the MEMS die by the signal generator is a fixed frequency electrical input.

In an embodiment, the electrical circuit is configured to determine a mechanical resonance frequency of a diaphragm of the MEMS die. In these embodiments, the electrical circuit is electrically connected to the MEMS die and includes a signal generator configured to inject a variable frequency electrical input into the MEMS die. In an embodiment, the variable frequency electrical input comprises a square wave having a random frequency.

In an embodiment, the signal generator is configured to inject the variable frequency electrical input across a predetermined range of frequencies. In an embodiment, the variable frequency electrical input comprises a square wave or a sine wave.

In an embodiment, the MEMS device further includes a base, a port, and a cover. The base has a first surface and a second surface opposite the first surface, and the port extends between the first and second surfaces of the base. The electrical circuit is disposed on the base, and the cover disposed over the first surface of the base covering the MEMS die and the electrical circuit.

In an embodiment, the electrical circuit includes an Application Specific Integrated Circuit ("ASIC") and/or a signal generator configured to inject an electrical input into the MEMS die.

Further disclosed herein, in general, is a method of application of a BIST to determine the health of a MEMS device. According to various embodiments of the method, the MEMS device includes a MEMS transducer and an electrical circuit.

According to an embodiment of the method, first, the MEMS transducer receives a test tone and produces a signal based on the test tone. Next, the MEMS transducer passes the signal through a first capacitor to produce a first output signal and a second capacitor to produce a second output signal. Then, the electrical circuit determines a ratio between the first output signal and the second output signal. Next, the electrical circuit determines a measured nominal capacitance of the MEMS transducer based on a ratio of the first and second output signals and a ratio of the capacitances of the first and second capacitors. Finally, the electrical circuit compares the measured nominal capacitance with an expected nominal capacitance of the MEMS transducer.

In another embodiment of the method, first, the MEMS transducer receives a variable frequency electrical input and produces a signal based on the variable frequency electrical input. Next, the electrical circuit determines a measured mechanical resonance frequency of the MEMS transducer based on the signal from the MEMS transducer. Finally, the electrical circuit compares the measured mechanical resonance frequency with an expected nominal mechanical resonance frequency of the MEMS transducer.

In an embodiment of the method, the variable frequency electrical input is received from a source external to the MEMS device. In an embodiment, the variable frequency electrical input received from a source external to the MEMS device is provided to the MEMS transducer by the electrical circuit.

In a MEMS die, for example a MEMS acoustic transducer, the die may include a diaphragm, a back plate, and an integrated electrical circuit. The MEMS die is supported by a base or substrate and enclosed by a housing. A MEMS diaphragm for example, for an acoustic transducer, can be a single monolithic layer of material or can be made from two or more layers of material. Sound energy traverses through the MEMS die, moves the diaphragm, and creates a changing electrical potential of the back plate, which creates an electrical signal. In such MEMS dies, the relative movement between the backplate and diaphragm causes a change in capacitance, which is detected by the integrated circuit and ultimately interpreted as sound.

In theory, an expected nominal capacitance of a MEMS die can be calculated. For example, it can be shown that a measured voltage output from a MEMS die for a microphone with an amplifier can be represented by:

$$\text{Output}=(\text{Gain})(\text{Input})(C_{mems}/(C_{mems}+C_{parasitic})) \quad (1)$$

where Output is the measured voltage output, Gain is the gain of the amplifier, Input is the unloaded sensitivity of the MEMS, $C_{mems}$ is the capacitance of the MEMS die, and $C_{parasitic}$ is a parasitic capacitance of other microphone circuitry, which for example includes an application specific integrated circuit ("ASIC"). If the unloaded sensitivity of the MEMS (Input), the parasitic capacitance ($C_{parasitic}$), and the gain (Gain) are known then equation (1) can be easily solved for $C_{mems}$.

In practice, however, the unloaded sensitivity of the MEMS (Input) has some variation and the parasitic capacitance ($C_{parasitic}$) is not well known. Therefore equation (1) actually has three unknowns and cannot be solved without further information. One path to a solution involves adding in in a test capacitor such that it is parallel to $C_{parasitic}$. If the test capacitor has a capacitance of $C_{Test}$ then even though the exact value of $C_{parasitic}$ isn't known, the value of $C_{Test}$ can be purposely selected to be very large compared to $C_{parasitic}$. In fact, if a large enough value of $C_{Test}$ is selected such that $C_{Test} \gg C_{parasitic}$, and the value of $C_{parasitic}$ can be effectively ignored. In this instance, equation (1) becomes:

$$\text{Output}=(\text{Gain})(\text{Input})(C_{mems}/(C_{mems}+C_{Test})) \quad (2)$$

where $C_{Test}$ has replaced $C_{parasitic}$.

Equation (2) is an improvement over equation (1) but it still has two unknowns, Input and $C_{mems}$ and so cannot be solved without further information. A solution is to measure the output of the MEMS die using two different values of $C_{Test}$. Assuming an amplifier having a gain of unity, this approach leads to equations (3) and (4):

$$\text{Output}_1=\text{Input}(C_{mems}/(C_{mems}+C_{Test1})) \quad (3)$$

$$\text{Output}_2=\text{Input}(C_{mems}/(C_{mems}+C_{Test2})) \quad (4)$$

Equations (3) and (4) represent a 2 by 2 array of linear equations having 2 unknowns, Input and $C_{mems}$. Thus, equations (3) and (4) can be solved thus yielding a value for the expected nominal capacitance of the MEMS die, $C_{mems}$. In addition, knowing a ratio of Output$_2$ to Output$_1$ and/or a ratio of $C_{Test2}$ to $C_{Test1}$ (C2 to C1 in FIGS. 1 and 2) also allows for solution of equations (3) and (4) for $C_{mems}$.

The health of a MEMS die, for example a MEMS acoustic transducer, can therefore be determined by comparing a measured nominal capacitance with a calculated expected nominal capacitance of the MEMS die. Any difference between the measured nominal capacitance and the calculated expected capacitance can indicate the presence of a particle or some contamination in the MEMS die.

An expected mechanical resonance frequency, $\omega_o$, of a diaphragm of a MEMS transducer can be estimated based on the mechanical compliance, $C_{dia}$, of the diaphragm and the effective mass, $L_{dia}$, of the diaphragm, where the resonance frequency is given by:

$$\omega_o=1/\text{SQRT}(L_{dia}C_{dia}) \quad (5)$$

Thus, the health of a MEMS die, for example a MEMS acoustic transducer, can be determined by comparing a measured mechanical resonance frequency with a calculated expected mechanical resonance frequency of the diaphragm of the MEMS die. The mass of a MEMS diaphragm wouldn't be expected to change so any difference between the measured mechanical resonance frequency and the expected mechanical resonance frequency can indicate the presence of a particle or some contamination on the diaphragm.

Figure 4:
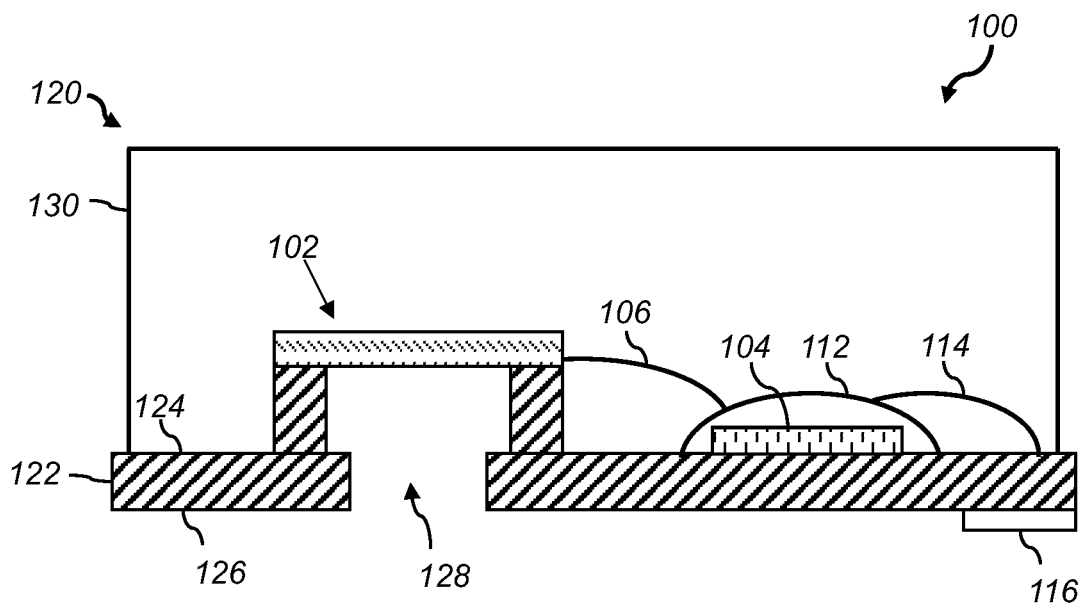
FIG. 4 is a side cross-sectional view of a MEMS device, according to an illustrative embodiment.

FIG. 1 illustrates an embodiment of an electrical circuit 200 as would be electrically connected to a MEMS die 102, for example, as shown in FIG. 4, and having a nominal capacitance $C_{MEMS}$. The electrical circuit 200 is configured to determine the nominal capacitance $C_{MEMS}$ of the MEMS die 102. In an embodiment, the electrical circuit 200 includes a charge pump 202 disposed in series with the MEMS die 102.

In an embodiment the electrical circuit 200 includes a first fixed test capacitor C1, for example having a capacitance value of $C_{Test1}$ as appears in equation (3), and a second fixed test capacitor C2, for example having a capacitance value of $C_{Test2}$ as appears in equation (4), illustrated disposed in parallel between an output of the MEMS die 102 and ground. Either the first fixed test capacitor C1 or the second fixed test capacitor C2 is connected with the output of the MEMS die 102, for example, via a switch 206. The switch 206 is configured such that when the first fixed test capacitor C1 is connected with the output of the MEMS die 102, the second test capacitor C2 is disconnected, and vice-versa.

Referring to the electrical circuit 200, when the MEMS die 102 is exposed to a test tone from a sound source, the first capacitor C1 produces a first output signal based on a signal received from the MEMS die 102, for example having a value of $Output_1$ as appears in equation (3), and the second capacitor C2 produces a second output signal based on the signal received from the MEMS die 102, for example having a value of $Output_2$ as appears in equation (4). The electrical circuit 200 is configured to determine the nominal capacitance $C_{MEMS}$ of the MEMS die 102 based on the known values of the first output signal and the second output signal and the known values of the capacitances of the first and second capacitors, C1 and C2. Alternatively, the electrical circuit 200 is configured to determine the nominal capacitance $C_{MEMS}$ of the MEMS die 102 based on a ratio of the first output signal to the second output signal and a ratio of the capacitances of the first and second capacitors, C1 and C2.

Still referring to FIG. 1, in an embodiment an amplifier 208 is connected to receive an input from either the first test capacitor C1 or the second test capacitor C2. The amplifier provides a first output when connected in parallel with the first test capacitor C1 or a second output when connected in parallel with the second test capacitor C2.

Figure 2:
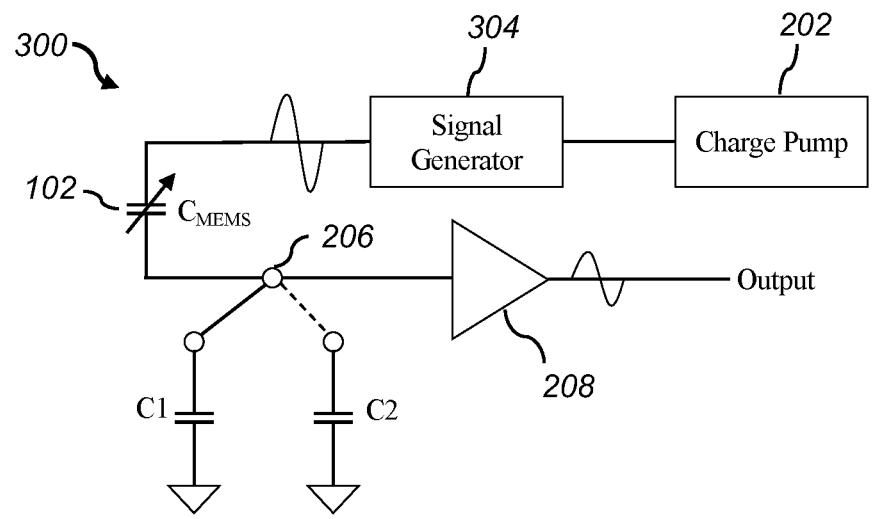
FIG. 2 is an example electrical circuit of the MEMS device configured to determine the nominal capacitance of a MEMS die, according to another illustrative embodiment.

FIG. 2 illustrates an embodiment of an electrical circuit 300, as would be electrically connected to the MEMS die 102, for example, as shown in FIG. 4. The electrical circuit 300 is configured to determine the nominal capacitance $C_{MEMS}$ of the MEMS die 102. The electrical circuit 300 is very similar to the electrical circuit 200 described hereinabove, but in addition to the components of the electrical circuit 200, the electrical circuit 300 further includes a signal generator 304 disposed between the charge pump 202 and the MEMS die 102. The signal generator 304 is configured to inject an electrical input into the MEMS die 102. In an embodiment the electrical input comprises at least a fixed frequency electrical input. The electrical input injected by the signal generator 304 functions to electrically mimic the application of a test tone from a sound source as described hereinabove. Including the signal generator 304 within the electrical circuit 300, therefore eliminates the need for a sound source to determine the nominal capacitance $C_{MEMS}$ of the MEMS die 102.

Referring to the electrical circuit 300, when the electrical input from the signal generator 304 is injected into the MEMS die 102 the first capacitor C1 produces a first output signal based on a signal received from the MEMS die 102, and the second capacitor C2 produces a second output signal based on the signal received from the MEMS die 102. Like the electrical circuit 200, the electrical circuit 300 is configured to determine the nominal capacitance $C_{MEMS}$ of the MEMS die 102 based on the known values of the first output signal and the second output signal and the known values of the capacitances of the first and second capacitors, C1 and C2. Alternatively, the electrical circuit 300 is configured to determine the nominal capacitance $C_{MEMS}$ of the MEMS die 102 based on a ratio of the first output signal to the second output signal and a ratio of the capacitances of the first and second capacitors, C1 and C2.

Figure 3:
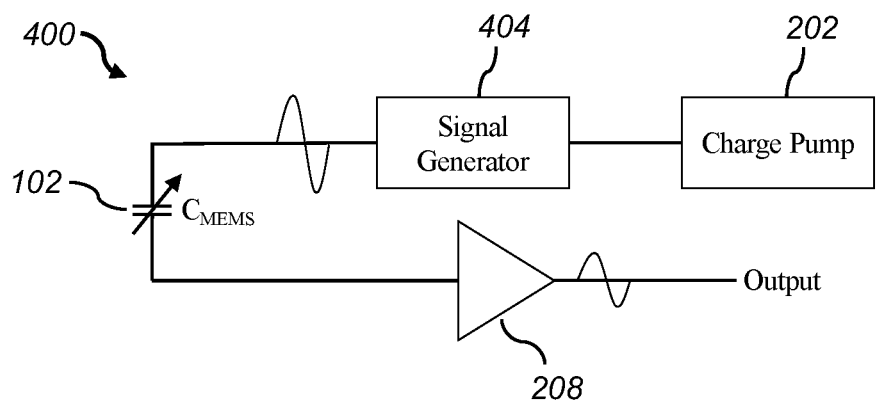
FIG. 3 is an example electrical circuit of the MEMS device configured to determine a mechanical resonance frequency of a MEMS die, according to an illustrative embodiment.

FIG. 3 illustrates an embodiment of an electrical circuit 400, as would be electrically connected to the MEMS die 102, for example, as shown in FIG. 4. In an embodiment the MEMS die 102 is a MEMS transducer having one or more diaphragms. The electrical circuit 400 is configured to determine a mechanical resonance frequency of the MEMS die 102. The electrical circuit 400 includes a signal generator 404 disposed between the charge pump 202 and the MEMS die 102. The signal generator 404 is configured to inject an electrical input into the MEMS die 102, for example, to cause a response in the MEMS die 102 like the response that would be caused by an external sound source. In an embodiment the electrical input comprises at least a variable frequency electrical input.

In an embodiment the variable frequency electrical input comprises a square wave or a sine wave having a random frequency. In an embodiment the signal generator 404 is configured to inject the variable frequency electrical input across a predetermined range of frequencies. In an embodiment the predetermined range of frequencies is from about 0 Hz to about 80,000 Hz. In another embodiment the variable frequency electrical input across a predetermined range of frequencies comprises a sine wave. In a further embodiment the variable frequency electrical input across a predetermined range of frequencies comprises a square wave.

Still referring to FIG. 3, the electrical circuit 400 further includes an amplifier 408 connected in series with and receiving an input the MEMS die 102. The amplifier 408 provides an output signal that can be analyzed to determine a measured resonance frequency of the MEMS die 102.

Turning to FIG. 4, a MEMS device according to an embodiment is shown schematically in cross-section. The MEMS device, generally labelled 100, includes a MEMS die 102 and an electrical circuit 104 electrically connected to the MEMS die 102, for example, by one or more electrical leads 106, depending on the MEMS die type. The electrical circuit 104 that is electrically connected with the MEMS die 102 can be any of the circuit embodiments 200, 300, 400 as described hereinabove.

In an embodiment, the MEMS device 100 includes an enclosure 120 that includes a base 122 having a first surface 124 and an opposing second surface 126. According to an embodiment, the base 122 includes a port 128 that extends between the first surface 124 and the second surface 126. In an embodiment, the electrical circuit 104 is disposed on the first surface 124 of the base 122. In another embodiment the electrical circuit 104 is disposed external to the MEMS device 100. The electrical circuit 104 may be implemented as an application specific integrated circuit ("ASIC") or may include an ASIC.

In an embodiment a cover 130 is disposed over the first surface 124 of the base 122 covering the MEMS die 102. In another embodiment the cover 130 is disposed over the first surface 124 of the base 122 covering the MEMS die 102 and the electrical circuit 104. The MEMS die 102 is acoustically coupled to the port 128. For example, the port 128 can be an aperture in the base 122 that permits sound to pass through the base 122 to the MEMS die 102. The embodiment of the MEMS device 100 in FIG. 4 is illustrated to be a bottom-port embodiment, but the port 128 can be located at other locations of the enclosure 120. For example, the port 128 can also be on the cover 130, which would be illustrative of a top-port embodiment. The port 128 can further be on a side of the enclosure 120, the port 128 can be anywhere else on the enclosure 120, or there can be no port 128, such as for a MEMS die vibration sensor or other sensor. According to a possible embodiment, when the MEMS die 102 includes at least one diaphragm (not shown), the diaphragm can be acoustically coupled to the port 128.

According to an embodiment, the MEMS device 100 includes an external-device interface 116 disposed on the second surface 126 of the base 122. The external-device interface 116 can be implemented as a surface-mount interface or can include leads configured for through-hole mounting on a host device. The electrical circuit 104 can also be coupled to contacts of the external-device interface 116, such as via an electrical lead 114 and/or leads running through the base 122. The electrical circuit 104 can receive an electrical signal from the MEMS die 102, such as via an electrical lead 106 and/or leads in the base 122, with a host device by using the contacts of the external-device interface 116. According to an embodiment, the electrical circuit 104 is covered by a protective coating 112.

Figure 5:
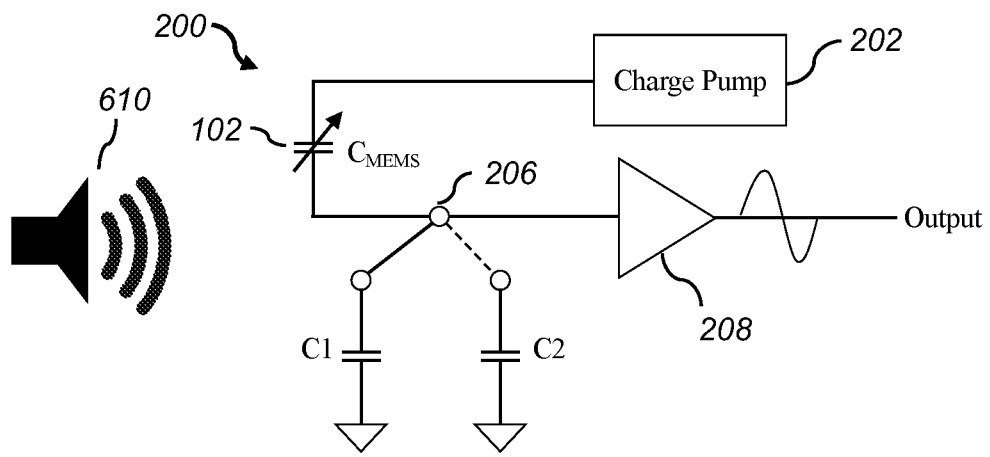
FIG. 5 illustrates the electrical circuit of FIG. 1 and a sound source according to an embodiment of a method for determining the health of a MEMS device.
Figure 6:
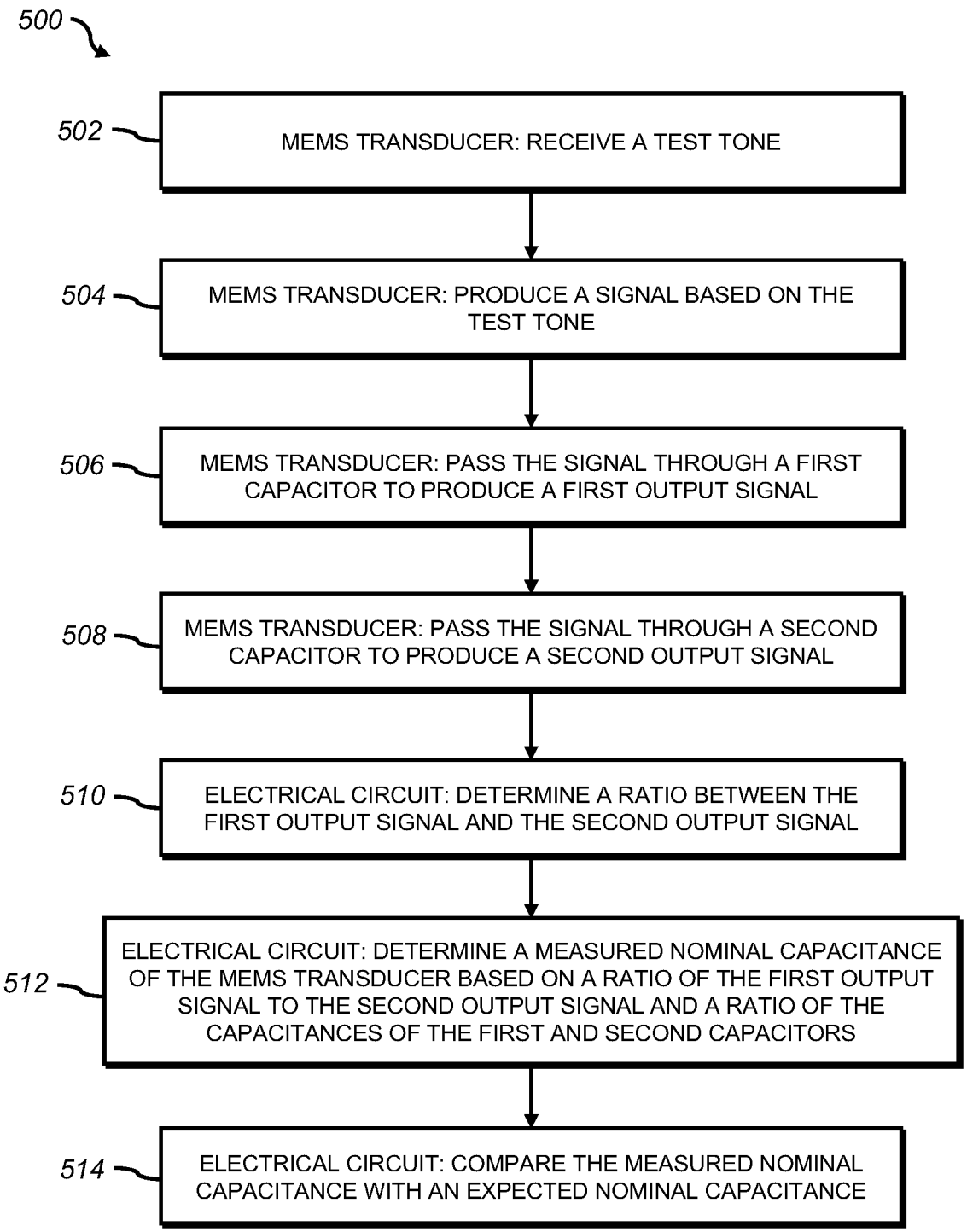
FIG. 6 is a flow diagram of a method for determining the health of a MEMS device based on a nominal capacitance of a MEMS transducer.

Referring to FIGS. 5 and 6, an embodiment of a method for determining the health of a MEMS device is disclosed. FIG. 5 schematically illustrates the electrical circuit 200 (shown in FIG. 1) exposed to a source of sound 610.

In the context of FIG. 5, FIG. 6 illustrates the steps in an embodiment of a method 500 for determining the health of a MEMS device 100 based on a measured nominal capacitance of the MEMS die 102, for example a MEMS transducer. At step 502, an external audio test tone, for example from the sound source 610, is received by the MEMS transducer 102. At step 504, the MEMS transducer 102 produces a signal based on the test tone. In step 506, the signal produced by the MEMS transducer 102 is passed through a first capacitor C1 to produce a first output signal. At step 508, the signal produced by the MEMS transducer 102 is passed through a second capacitor C2 to produce a second output signal.

Still referring to FIG. 6, at step 510, the electrical circuit 200 determines a ratio between the first output signal and the second output signal produced by the MEMS transducer 102. At step 512, the electrical circuit determines a measured nominal capacitance of the MEMS transducer 102 based on the ratio of the first output signal to the second output signal and a ratio of the capacitances of the first and second capacitors, C1 and C2. At step 514, the electrical circuit 200 compares the measured nominal capacitance with an expected nominal capacitance. The measured nominal capacitance of the MEMS transducer 102 may be compared or otherwise assessed to baseline or reference information. Such assessment may be performed by the electrical circuit 200 or other circuitry disposed on or within the MEMS device 100 or alternatively the measured nominal capacitance may be ported to a host or other device for assessment.

In an alternative embodiment of the method illustrated in FIG. 6, the external audio tone is replaced by an electrical input generated by a signal generator 304 of the electrical circuit 300 and injected into the MEMS transducer 102. In an embodiment the electrical input generated by the signal generator 304 and injected into the MEMS transducer 102 comprises a fixed frequency electrical input. The MEMS transducer 102 receives the electrical input from the signal generator 304 of electrical circuit 300 and produces a signal based on the electrical input. The signal is passed through the first capacitor C1 to produce a first output signal and through the second capacitor C2 to produce a second output signal. The electrical circuit 300 determines a ratio between the first output signal and the second output signal, and further determines a measured nominal capacitance of the MEMS transducer 102 based on a ratio of the first output signal to the second output signal and a ratio of the capacitances of the first and second capacitors, C1 and C2.

The electrical circuit 300 compares the measured nominal capacitance with an expected nominal capacitance. The measured nominal capacitance of the MEMS transducer 102 may be compared or otherwise assessed to baseline or reference information. Such assessment may be performed by the electrical circuit 300 or other circuitry disposed on or within the MEMS device 100 or alternatively the measured nominal capacitance may be ported to a host or other device for assessment.

Figure 7:
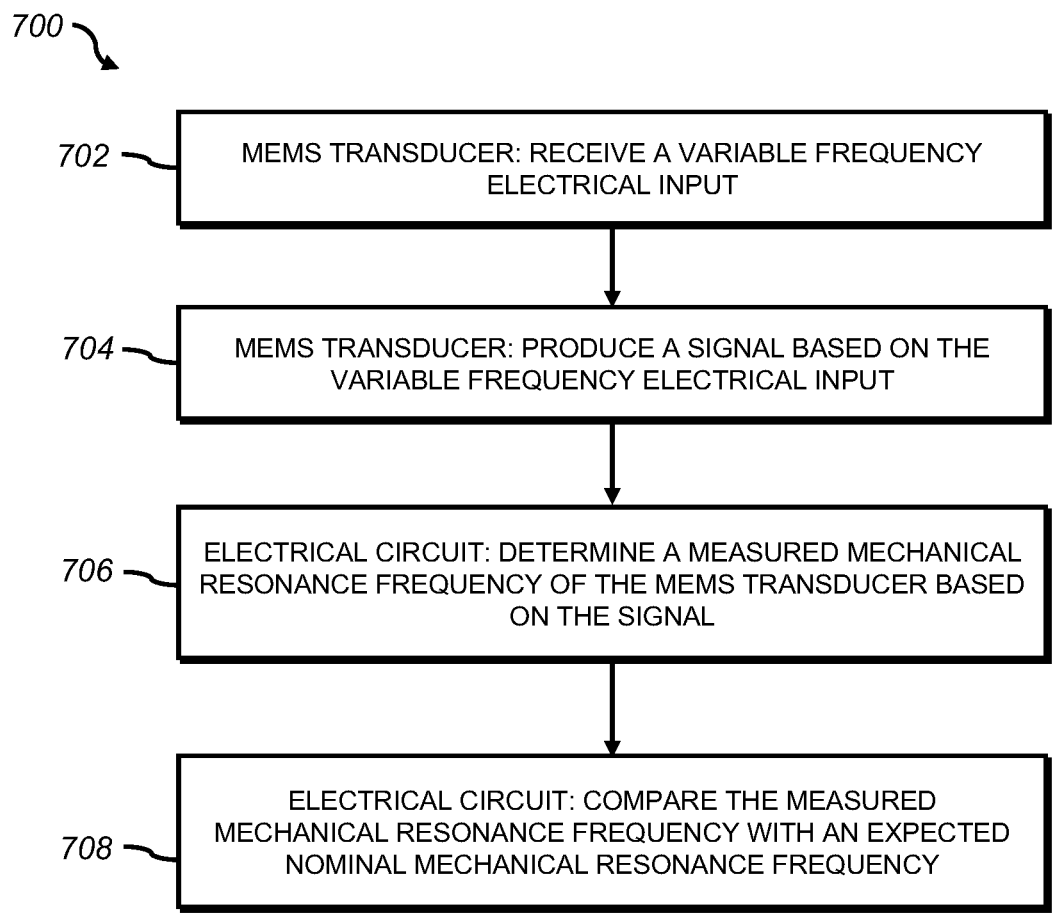
FIG. 7 is a flow diagram of a method for determining the health of a MEMS device based on a mechanical resonance frequency of a MEMS transducer.

FIG. 7 illustrates the steps in an embodiment of a method 600 for determining the health of a MEMS device 100 based on a measured mechanical resonance frequency of a MEMS die 102, for example a MEMS transducer. The steps of the method 700 may be performed via an electrical circuit 400 that is part of the MEMS device 100 or the steps of the method 700 may be performed via an electrical circuit 400 that is external to the MEMS device 100, or by a host device in communication with the MEMS device 100.

At step 702, a variable frequency electrical input from a signal generator 404 is received by a MEMS die 102, for example a MEMS transducer. At step 704, the MEMS transducer 102 produces a signal based on the variable frequency electrical input. At step 706, the electrical circuit 400 determines a measured mechanical resonance frequency of the MEMS transducer 102 based on the signal produced by the MEMS transducer 102. At step 708, the electrical circuit 400 compares the measured mechanical resonance frequency with an expected nominal mechanical resonance frequency. As discussed herein the measured mechanical resonance frequency of the MEMS transducer 102 may be compared or otherwise assessed to baseline or reference information. Such assessment may be performed by the electrical circuit 400 or other circuitry disposed on or within the MEMS device 100 or alternatively the measured mechanical resonance frequency may be ported to a host or other device for assessment.

In an embodiment of the method 700 the variable frequency electrical input received by the MEMS transducer 102 is received from a source external to the MEMS device 100. In another embodiment of the method 700 the variable frequency electrical input received by the MEMS transducer 102 is received from a source external to the MEMS device 100 and it is the electrical circuit 400 that is external to the MEMS device 100 providing the variable frequency electrical input to the MEMS transducer 102.

In other embodiments of the method 700, the variable frequency electrical input is across a predetermined range of frequencies generated by the signal generator 404 and injected into the MEMS transducer 102. In further embodiments the predetermined range of frequencies is from about 0 Hz to about 80,000 Hz. In other embodiments the variable frequency electrical input comprises a sine wave or a square wave input across the predetermined range of frequencies, or in further embodiments the variable frequency electrical input comprises a sine wave or a square wave input having a random frequency.

The herein described subject matter sometimes illustrates different components contained within, or connected with, different other components. It is to be understood that such depicted architectures are illustrative, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality, and any two components capable of being so associated can also be viewed as being "operably couplable," to each other to achieve the desired functionality. Specific examples of operably couplable include but are not limited to physically mateable and/or physically interacting components and/or wirelessly interactable and/or wirelessly interacting components and/or logically interacting and/or logically interactable components.

With respect to the use of plural and/or singular terms herein, those having skill in the art can translate from the plural to the singular and/or from the singular to the plural as is appropriate to the context and/or application. The various singular/plural permutations may be expressly set forth herein for sake of clarity.

It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.).

Although the figures and description may illustrate a specific order of method steps, the order of such steps may differ from what is depicted and described, unless specified differently above. Also, two or more steps may be performed concurrently or with partial concurrence, unless specified differently above. Such variation may depend, for example, on the software and hardware systems chosen and on designer choice. All such variations are within the scope of the disclosure. Likewise, software implementations of the described methods could be accomplished with standard programming techniques with rule-based logic and other logic to accomplish the various connection steps, processing steps, comparison steps, and decision steps.

It will be further understood by those within the art that if a specific number of an introduced claim recitation is intended, such an intent will be explicitly recited in the claim, and in the absence of such recitation, no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to inventions containing only one such recitation, even when the same claim includes the introductory phrases "one or more" or "at least one" and indefinite articles such as "a" or "an" (e.g., "a" and/or "an" should typically be interpreted to mean "at least one" or "one or more"); the same holds true for the use of definite articles used to introduce claim recitations. In addition, even if a specific number of an introduced claim recitation is explicitly recited, those skilled in the art will recognize that such recitation should typically be interpreted to mean at least the recited number (e.g., the bare recitation of "two recitations," without other modifiers, typically means at least two recitations, or two or more recitations).

Furthermore, in those instances where a convention analogous to "at least one of A, B, and C, etc." is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). In those instances where a convention analogous to "at least one of A, B, or C, etc." is used, in general, such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, etc.). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

Further, unless otherwise noted, the use of the words "approximate," "about," "around," "substantially," etc., mean plus or minus ten percent.

The foregoing description of illustrative embodiments has been presented for purposes of illustration and of description. It is not intended to be exhaustive or limiting with respect to the precise form disclosed, and modifications and variations are possible in light of the above teachings or may be acquired from practice of the disclosed embodiments. It is intended that the scope of the invention be defined by the claims appended hereto and their equivalents.

What is claimed is:

1. A microelectromechanical systems (MEMS) device comprising:
   a MEMS die; and
   an electrical circuit electrically connected to the MEMS die, the electrical circuit comprising:
      a first capacitor that produces a first output signal based on a signal received from the MEMS die, and
      a second capacitor that produces a second output signal based on the signal received from the MEMS die,
   wherein the electrical circuit is configured to determine a nominal capacitance of the MEMS die based on a ratio of the first output signal to the second output signal and a ratio of the capacitances of the first and second capacitors.

2. The MEMS device of claim 1, further comprising:
   a base having a first surface, an opposing second surface, and a port, wherein the port extends between the first surface and the second surface;
   wherein the electrical circuit is disposed on the first surface of the base; and
   a cover disposed over the first surface of the base covering the MEMS die and the electrical circuit.

3. The MEMS device of claim 2, wherein the electrical circuit comprises an Application Specific Integrated Circuit (ASIC).

4. The MEMS device of claim 1, wherein the electrical circuit further comprises a signal generator configured to inject an electrical input into the MEMS die.

5. The MEMS device of claim 4, wherein the electrical input comprises a fixed frequency electrical input.

6. The MEMS device of claim 5, further comprising:
   a base having a first surface, an opposing second surface, and a port, wherein the port extends between the first surface and the second surface;

wherein the electrical circuit is disposed on the first surface of the base; and a cover disposed over the first surface of the base covering the MEMS die and the electrical circuit.

7. The MEMS device of claim 6, wherein the electrical circuit comprises an Application Specific Integrated Circuit (ASIC).

8. A method for determining the health of a MEMS device, the MEMS device comprising a MEMS transducer and an electrical circuit, the method comprising:

the MEMS transducer
receiving a test tone;
producing a signal based on the test tone;
passing the signal through a first capacitor to produce a first output signal;
passing the signal through a second capacitor to produce a second output signal; and the electrical circuit
determining a ratio between the first output signal and the second output signal;
determining a measured nominal capacitance of the MEMS transducer based on the ratio of the first output signal to the second output signal and a ratio of the capacitances of the first and second capacitors;

comparing the measured nominal capacitance with an expected nominal capacitance.

* * * * *